United States Patent [19]

Nishida

[11] Patent Number: 4,990,997

[45] Date of Patent: Feb. 5, 1991

[54] CRYSTAL GRAIN DIFFUSION BARRIER STRUCTURE FOR A SEMICONDUCTOR DEVICE

[75] Inventor: Kenji Nishida, Inagi, Japan

[73] Assignee: Fujitsu Limited, Kanagawa, Japan

[21] Appl. No.: 337,999

[22] Filed: Apr. 14, 1989

[30] Foreign Application Priority Data

Apr. 20, 1988 [JP] Japan .................................. 63-97762

[51] Int. Cl.$^5$ ............................................ H01L 23/48
[52] U.S. Cl. ...................................... 357/71; 357/60;
357/65; 357/68; 357/2; 357/59
[58] Field of Search .................... 357/71, 60, 65, 71 P, 357/2, 68, 59 B, 59 H

[56] References Cited

U.S. PATENT DOCUMENTS 4,702,967 10/1987 Black et al. ........................ 357/71 X
4,829,363 5/1989 Thomas et al. ....................... 357/71

FOREIGN PATENT DOCUMENTS 60-66465 4/1985 Japan .................................... 357/71
60-119755 6/1985 Japan .................................... 357/71
61-156872 7/1986 Japan .................................... 357/71
61-256766 11/1986 Japan .................................... 357/71

OTHER PUBLICATIONS

Ting et al., "The Use of Titanium-Based Contact Barrier Layers in Silicon Technology," *Thin Solid Films*, vol. 96, No. 4, Oct. 1982, pp. 327-345.

Lee et al, "Effect of Oxygen on the Diffusion Barrier Properties," Proceedings 4th Intl. IEEE Multilevel Interconnection Conf., 15-18 Jun. 1987, Santa Clara, U.S.A., pp. 344-350.

Ho et al, "Use of Coherency Strains in Epitaxial Multilayers to Inhibit Circuit Failure by Electromigration", *IBM Technical Disclosure Bulletin*, vol. 15, No. 12, May 1983, pp. 3742-3744.

Wittmer, "Barrier Layers: Principles and Applications in Microelectronics," *J. Vac. Sci. Technol. A*, vol. 2, No. 2, Apr.-Jun. 1984, pp. 273-280.

Howard, "Electromigration Improvement of Al-Cu or Au Conductors," *IBM Technical Disclosure Bulletin*, vol. 21, No. 12, May, 1979, 4837-4838.

Ho, "General Aspects of Barrier Layers for Very-Large-Scale Integration Applications I: Concepts," *Thin Solid Films*, 96 (1982) 301-316.

M. —A. Nicolet, "Diffusion Barrier in Thin Films", *Thin Solid Films*, vol. 52, pp. 415-443.

J. B. Stimmel and B. N. Mehrotra, "Effects of Oxygen on Reactively Sputtered Tin Films", In: Tungsten and Other Refractory Metals for VLSI Applications III (V. A. Wells ed.), pp. 375-382, materials Research Society, 1988.

*Primary Examiner*—William Mintel
*Attorney, Agent, or Firm*—Armstrong, Nikaido, Marmelstein, Kubovcik, & Murray

[57] ABSTRACT

A diffusion barrier structure includes a first barrier layer provided on a substrate of a semiconductor device for preventing transport of component elements of the substrate and the electrode from passing therethrough by diffusion. An interface layer is formed in the first barrier layer adjacent to a top surface of the first barrier layer for eliminating the effect of microstructure in the first barrier layer on crystal growth to be made on the first barrier layer. A second barrier layer of a same material as the material of the first barrier layer is provided on the first barrier layer so as to be sandwiched between the first barrier layer and the metal electrode for preventing the component elements from being transported therethrough by diffusion.

6 Claims, 7 Drawing Sheets

PRIOR ART

FIG. 2

PRIOR ART

CRYSTAL GRAIN DIFFUSION BARRIER STRUCTURE FOR A SEMICONDUCTOR DEVICE

BACKGROUND OF THE INVENTION

The present invention relates in general to semiconductor devices and in particular to a diffusion barrier structure used in a semiconductor device for suppressing reaction between a wiring electrode and a semiconductor substrate.

In conventional semiconductor devices, an aluminum-based wiring electrode made of aluminum or aluminum-silicon alloy is contacted with a silicon substrate directly. In such a structure, there is a problem in that aluminum wiring electrode reacts with silicon the substrate when the semiconductor device is held at a relatively high temperature such as 450° C. during the manufacturing process of the semiconductor device. When such a reaction occurs, silicon is dissolved into the aluminum electrode and there is a tendency that silicon thus dissolved into the electrode is precipitated at a boundary between the electrode and the substrate as an epitaxial phase. When the epitaxial silicon phase is grown at the boundary, the resistivity across the contact is increased. Further aluminum in the electrode, too, is diffused into the silicon substrate from the electrode and forms an alloy spike structure in the substrate which is a sharp-pointed spike-like region enriched in aluminum. The alloy spike extends into the interior of the substrate from the boundary between the electrode and substrate and causes unwanted short-circuit conduction at a junction of the semiconductor device in the substrate particularly when the junction is formed in an extremely shallow region of the substrate. When such an unwanted conduction occurs, the semiconductor device no longer operates properly.

In order to eliminate these problems associated with the reaction between the silicon substrate and the aluminum or aluminum alloy wiring electrode, use of a diffusion barrier structure is proposed in which the reaction between the silicon substrate and the electrode is blocked by a barrier layer provided between the electrode and the substrate. This barrier layer is generally called a barrier metal layer although the material for the barrier layer is not limited to metals. In the present specification, the barrier layer will be referred to as barrier metal layer according to general practice. Such a barrier metal layer prevents the diffusion of silicon and aluminum passing therethrough. The barrier metal layer may be a film of titanium nitride (TiN) or a titanium tungstenite (TiW) and is deposited on the substrate by reactive sputtering, evaporation, chemical vapor deposition (CVD) and the like before the deposition of the wiring electrode.

It has been found, however, that the conventional barrier metal layer cannot prevent the diffusion of silicon and aluminum effectively particularly when a thin barrier metal layer is used. The reason of this unsatisfactory result is generally attributed to the microstructure of the barrier metal itself. More specifically, the barrier metal layer deposited on the substrate generally has a columnar microstructure in which the grain of the material is elongated generally perpendicularly to the plane of the substrate, and the grain boundary between the elongated grains in the barrier/metal layer provides a diffusion path for silicon and aluminum. As the grain boundary generally extends through the barrier metal layer from one side to the other, it is reasonable to assume that a substantial number of silicon and aluminum atoms pass through the barrier metal layer relative ease by diffusion.

In order to minimize the diffusion across the barrier layer, one has to use a relatively thick barrier metal layer such as 1500 Å or more. However, such a thick barrier metal layer is disadvantageous due to the increased stress in the barrier metal layer. Further, the resistance of the diffusion barrier structure is increased with increasing thickness of the barrier metal layer.

Alternatively, it is proposed to oxygenate the barrier metal layer thus formed in order to prevent the diffusion of aluminum and silicon through the grain boundary. In doing so, it is assumed that the oxygen penetrates into the barrier metal through the grain boundary and the diffusion path is blocked by oxygen.

Experimental result did show such a decrease in the diffusion of elements across the barrier metal layer with oxygenation, but at the same time it was shown that the resistivity of the barrier metal layer increases with increasing oxygen content in the barrier metal layer (Stimmel J. B. and Mehrotra B. N. "Effects of Oxygen on Reactively Sputtered TiN Films". In: Tungsten and Other Refractory Metals for VLSI Applications III, V. A. Wells ed., pp. 375-382, Materials Research Society, 1988). Such an observation suggests the possibility that oxygen does not only exist at the grain boundary but also exists at the surface of the barrier metal layer in a form of oxide. In other words, the surface of the barrier metal layer is oxidized as a result of the oxygenation. In order to prevent the diffusion of silicon and aluminum across the barrier metal layer effectively by oxygenation, a substantial amount of oxygen has to be introduced into the barrier metal layer particularly when the thickness of the barrier metal layer is thin. However, such an oxygenation increases the resistivity of the barrier metal layer as already described. Therefore, the oxygenation of the conventional barrier metal layer in the diffusion barrier structure is not preferable from the view point of the increased resistivity across the diffusion barrier structure.

SUMMARY OF THE INVENTION

Accordingly, it is a general object of the present invention to provide a novel and useful diffusion barrier structure wherein the problems aforementioned are eliminated.

Another and more specific object of the present invention is to provide a diffusion barrier structure wherein the diffusion of elements across a barrier metal layer of the diffusion barrier structure is effectively prevented without increasing the thickness of barrier metal layer used in the structure.

Another object of the present invention is to provide a diffusion barrier structure wherein the diffusion of elements across a barrier metal layer of the diffusion barrier structure is effectively prevented without incorporating a substantial amount of oxygen content into the barrier metal layer.

Another object of the present invention is to provide a diffusion barrier structure comprising a first barrier metal layer deposited on a substrate and a second barrier metal layer further deposited on the first barrier metal layer wherein the first and second barrier metal layers are made from a same material having a columnar microstructure including elongated crystal grains which extend perpendicularly to the plane of the substrate. Each of the grains in the first barrier metal layer is discordant to the grains in the second barrier metal layer such that a grain boundary extending along the elongated crystal grain is interrupted at an interface between the first barrier metal layer and the second barrier metal layer. According to the present invention, the diffusion path of the elements through the barrier metal layer along the grain boundary is discontinued at the interface and the reaction between the substrate and a wiring electrode deposited on the second barrier metal layer due to the diffusion of elements through the barrier metal structure is effectively suppressed. In such a structure, each of the plurality of the barrier metal layers can be made to have a reduced thickness and the overall thickness of the diffusion barrier structure can be reduced. As a result of the reduced thickness of the individual barrier metal layers, the mechanical stress accumulated in the diffusion barrier structure is reduced. Further, such a structure provides an advantage in that the diffusion path of elements along the grain boundary can be blocked easily by a small amount of oxygen introduced into the barrier metal layer by heat treatment without causing substantial increase in the resistivity of the barrier metal layer. This is because the grain boundary to be blocked by the oxygen is shortened as a result of the reduced thickness of the individual barrier metal layers. In contrast, conventional diffusion barrier structure can provide a satisfactory performance only when the thickness and amount of oxygen introduced into the barrier metal layer is significantly larger than those of the structure of the present invention. As already described, such an excessive oxygenation causes oxidization of the surface of the barrier metal layer which invites an unwanted increase in the resistivity of the barrier metal layer.

Still other objects and further features of the present invention will become apparent from the following detailed description when read in conjunction with attached drawings.

DETAILED DESCRIPTION

First, a prior art diffusion barrier structure and a manufacturing process thereof will be described with reference to FIGS. 1(A)–(E).

Figure 1A:
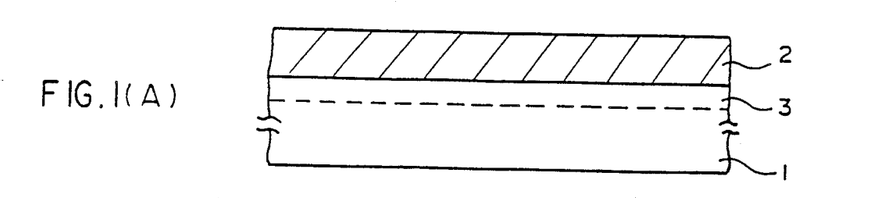
FIGS. 1(A)–1(D) are cross sectional views showing steps to form a prior art diffusion barrier structure.
Figure 1B:
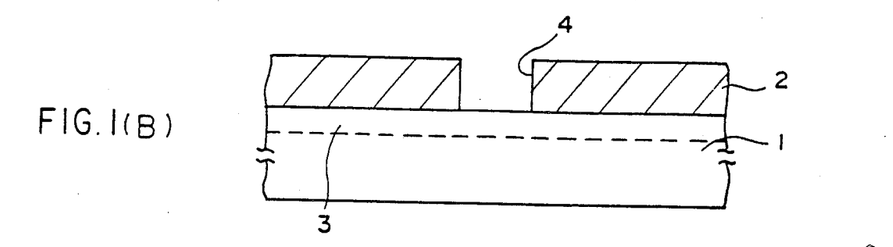

Referring to FIG. 1(A), an insulator layer 2 which may be a phospho-silicate glass (PSG) layer is deposited on a silicon substrate 1. In a surface region 3 of the substrate 1, a semiconductor device such as an MOS transistor is formed. The region 3 may be a source or drain region of the MOS transistor. In a step of FIG. 1(B), a contact hole 4 is formed in the insulator layer 2. In a step of FIG. 1(C), a barrier metal layer 5 which may be a layer of titanium-based compound such as titanium nitride (TiN) or titanium tungstenite (TiW) is deposited on the structure obtained in the step of FIG. 1(B) by a reactive sputtering, ion plating, evaporation, or a CVD technique as indicated by arrows in the drawing. Finally, in a step of FIG. 1(D), a wiring conductor layer 6 which may be aluminum or an aluminum alloy containing silicon is deposited on the structure of FIG. 1(C). Thus, the prior art diffusion barrier structure obtained by this method has a structure shown in FIG. 1(D) which comprises a single barrier metal layer 5.

Figure 2:
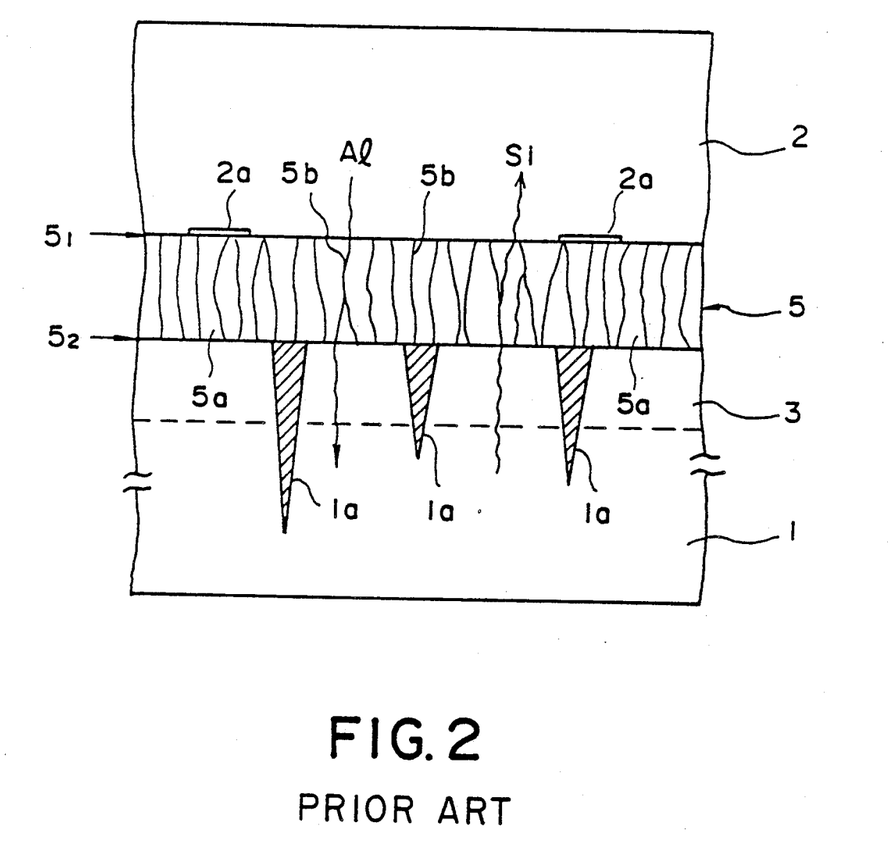
FIG. 2 is a cross sectional view showing a microstructure of a prior art diffusion barrier structure.

FIG. 2 shows a typical microstructure of the barrier metal layer 5 of the diffusion barrier structure thus formed in an enlarged scale. Referring to the drawing, the barrier metal layer 5 has a generally columnar microstructure in which columnar or elongated crystal grains 5a of the barrier metal such as titanium nitride or titanium tungstenite are grown generally perpendicularly to the plane of the substrate 1. In such a structure, the grain boundary represented in the drawing by a reference numeral 5b extends generally from one side $5_1$ of the barrier metal layer 5 to another side $5_2$ without interruption, as each of the grains 5a extends generally from the side $5_1$ to the side $5_2$ continuously. Such a grain boundary 5b is expected to have a relatively low potential energy as compared to the parts inside the crystal grain 5a and it is generally accepted that aluminum in the wiring conductor layer 2 or the silicon in the substrate 1 penetrates into the barrier metal layer 5 along the grain boundary 5b as schematically illustrated in FIG. 2 because of the reduced activation energy of diffusion. When such a penetration of aluminum and silicon into the barrier metal layer occurs, they are transported to the other side of the barrier metal layer 5 along the grain boundary 5b relatively easily. When aluminum has reached the substrate 1, alloy spikes 1a are formed in the substrate 1 as illustrated. Such an alloy spike causes unwanted short-circuit conduction in a junction formed in the region 3. When silicon is transported to the wiring conductor layer 2, on the other hand, it tends to precipitate at the boundary $5_2$ in a form of epitaxial phase 2a. Such an epitaxial phase increases the resistivity across the wiring conductor layer 6 and the substrate 1.

In order to suppress the diffusion of aluminum and silicon across the barrier metal layer 5, a relatively thick barrier metal layer is used in the conventional diffusion barrier structure. However, deposition of such a thick barrier metal layer 5 causes a substantial mechanical stress in the layer and there is a practical limitation in the thickness of the barrier metal layer 5. Further, the thick barrier metal layer has an increased resistance which is disadvantageous for the diffusion barrier structure used for connecting the electrode to the substrate electrically. Alternatively, it is proposed to introduce oxygen into the barrier metal layer 5 by annealing the structure obtained in the step of FIG. 1(C) in an atmosphere containing oxygen or by depositing the barrier metal layer 5 in an atmosphere containing small amount of oxygen. Such a procedure is called oxygenation. By doing so, it is expected that oxygen is incorporated into the barrier metal layer 5 along the grain boundary 5b and blocks the diffusion path of aluminum and silicon extending along the grain boundary 5b. In order to prevent the diffusion effectively by oxygenation for a barrier metal layer, however, it is necessary to introduce a substantial amount of oxygen into the barrier metal layer 5. With such an extensive oxygenation, it is inevitable that the surface of the barrier metal layer 5 is oxidized substantially. In other words, there is formed a layer of oxide having a substantial thickness at the surface of the barrier metal layer and the resistivity of the barrier metal layer is increased.

Next, the diffusion barrier structure of the present invention will b described.

Figure 3A:
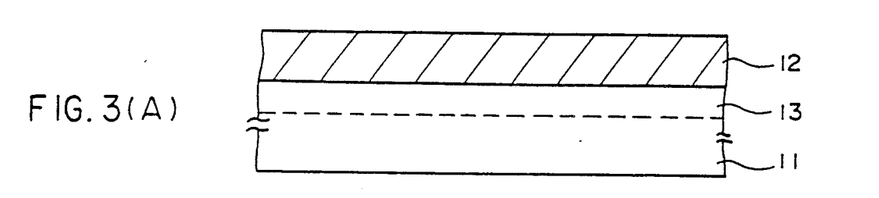
FIGS. 3(A)–3(F) are cross sectional views showing various steps to form the diffusion barrier structure of the present invention.
Figure 3B:
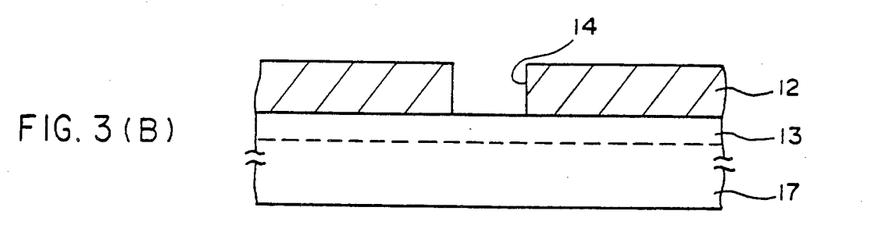

Referring to FIG. 3(A), a silicon substrate 11 similar to the substrate 1 is prepared and an insulator layer 12 similar to the insulator layer 2 is deposited on the substrate 11. In a surface region of the substrate 11, a semiconductor device 13 is formed similarly to the substrate 1. As already described this region 13 may be the source or drain region of an MOS transistor. Alternatively, the part 13 may include base and collector regions of a bipolar transistor. Next, a contact hole 14 is formed through the insulator layer 12 in a step of FIG. 3(B). In a step of FIG. 3(C), a first barrier metal layer 15 such as titanium nitride or titanium tungstenite is deposited on the structure of FIG. 3(B) for a thickness of about 500 Å by reactive sputtering and the like. In the following description, it is assumed that the layer 15 comprises titanium nitride. However, titanium tungstenite or other suitable material may be used for the layer 15 as well.

Figure 3C:
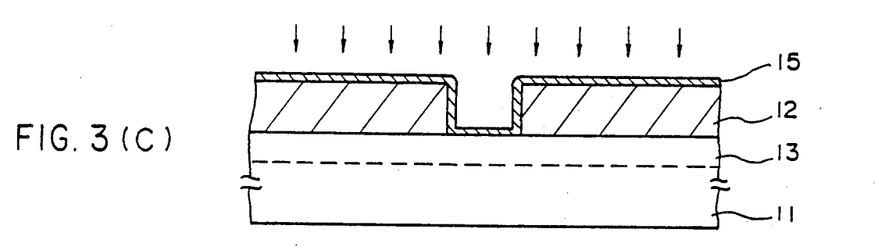
Figure 3D:
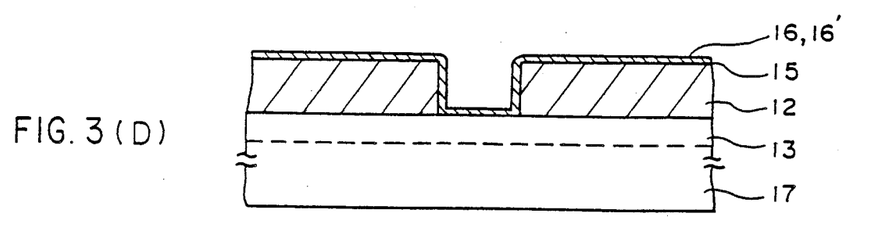

The barrier metal layer 15 is defined by a top surface 16. This top surface 16 acts as an interface for interrupting a microstructure formed in the barrier metal layer 15 as will be described so that the microstructure of the barrier metal layer 15 does not influence grain growth of barrier metal crystals in another or second barrier metal layer to be deposited on the surface 16. The term "microstructure" means a microscopic structure formed in the barrier metal layer by numerous crystal grains of barrier metal such as titanium nitride and the grain boundary defined between the crystal grains. For this purpose, a thin region 16' denoted hereinafter as an interface layer 16' is formed in the layer 15 adjacent to the surface 16 so as to erase or modify the microstructure at the surface 16. This interface layer 16' may be an amorphous layer of titanium nitride or titanium tungstenite formed on the surface of the barrier metal layer 15 by ion implantation of titanium and the like. Implantation of titanium with an acceleration voltage of about 50 keV for a level of $10^{13}$–$10^{15}$/cm$^3$ is sufficient for erasing the microstructure from the surface 16. Alternatively, the interface layer 16' may be an extremely thin region containing oxygen.

When forming the interface layer 16' by oxygenation, the interface layer 16' is not necessarily a layer of oxide having a substantial thickness to cover the entire surface of the barrier metal layer 15 uniformly but may be a mere surface added with a small amount of oxygen for an extent sufficient to erase the grain boundary from the top surface 16. The layer 16' is so thin that the surface 16 and the layer 16' are represented as a same part in the drawings.

Figure 1C:
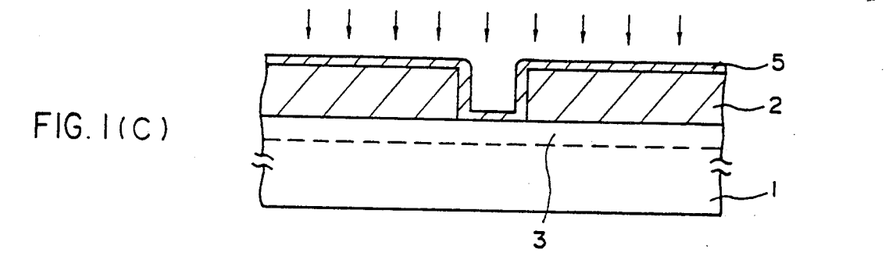
Figure 1D:
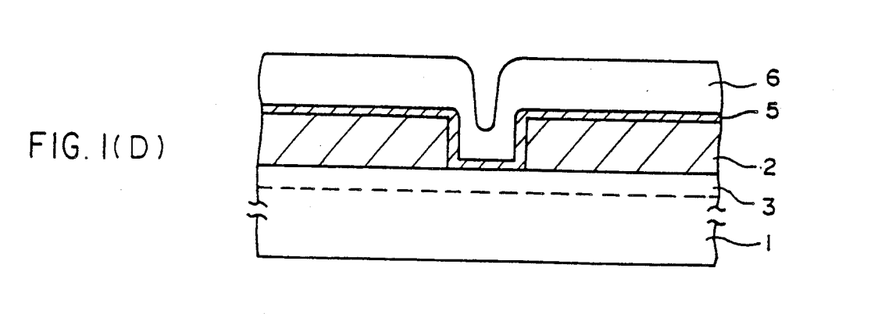
Figure 3E:
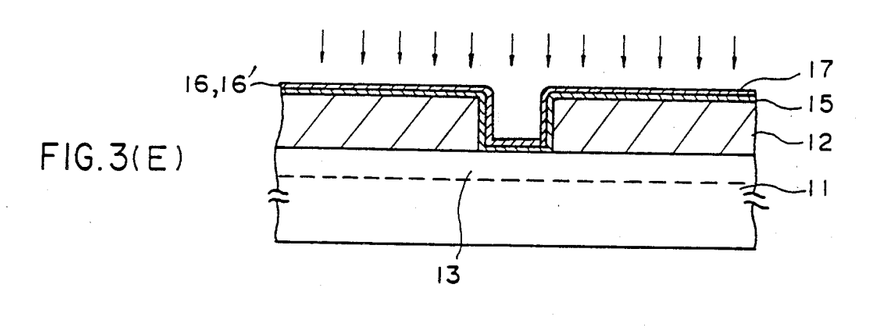
Figure 3F:
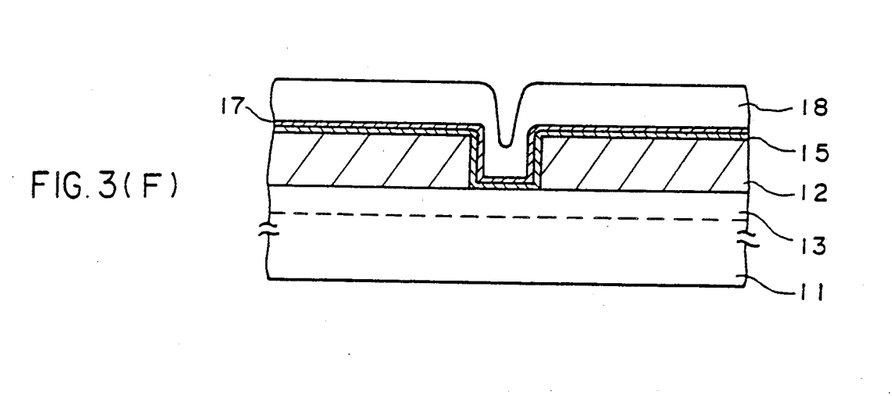

Next, another barrier metal layer 17 corresponding to the second barrier metal layer is deposited on the surface 16 in a step of FIG. 3(E) similarly to the step of FIG. 1(C) by reactive sputtering and the like. Then, an aluminum or aluminum alloy wiring conductor layer 18 is deposited in a step of FIG. 3(F) on the structure obtained in the step of FIG. 3(E).

Figure 4:
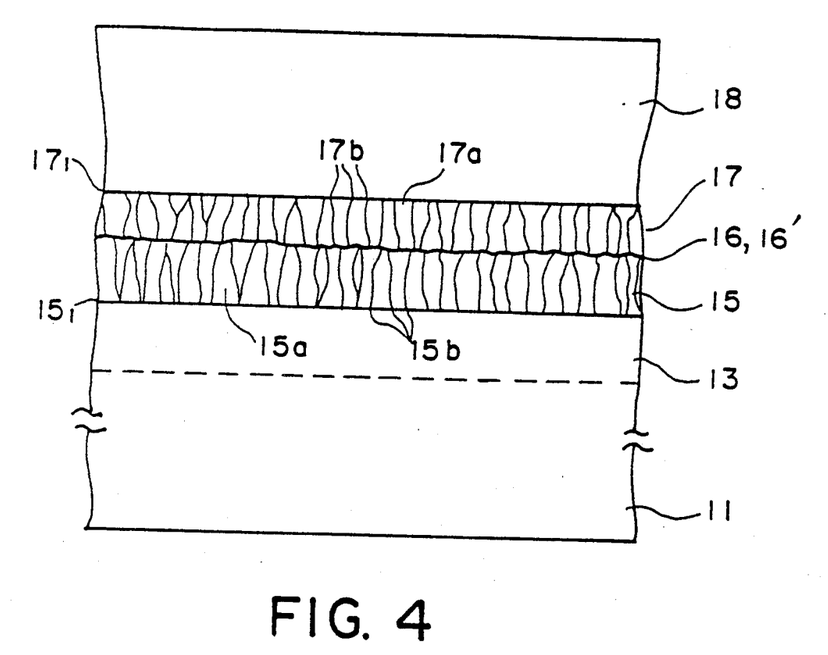
FIG. 4 is an enlarged cross sectional view showing a part of the diffusion barrier structure of an embodiment of the present invention.

FIG. 4 shows a cross section of the diffusion barrier structure thus obtained. Similarly to the structure of FIG. 2, crystal grains 15a of the barrier metal layer 15 elongate generally perpendicularly to the plane of the substrate 11 towards the top surface 16 from a boundary $15_1$ between the substrate 11 and the barrier metal layer 15. Similarly, crystal grains 17a of the barrier metal layer 17 elongate generally perpendicularly to the substrate 11 from the surface 16 to a boundary 17a between the barrier metal layer 17 and the wiring conductor layer 18. An essential feature of the structure of FIG. 4 is that the growth of the crystal grains 15a grown upwards from the boundary $15_1$ is discontinued at the surface 16 of the barrier metal layer 15 so that the crystal grains 17a are newly grown on the surface 16 without any relation with the microstructure in the barrier metal layer 15 located underneath. In other words, the grain boundaries 15b and 17b are disconnected at the surface 16. As a result of the interruption of the grain boundaries 15b and 17b, the diffusion path of aluminum and silicon across the barrier metal layers 15 and 17 along the grain boundaries 15b and 17b is effectively interrupted. Without the interface layer 16' formed on the surface 16, the crystal grains 17a are grown as an extension of the grains 15a in the barrier metal layer 15 and the diffusion path is not interrupted.

It should be noted that the number of the barrier metal layers 15 and 17 is not limited to two but more than three barrier metal layers may be used as well.

EXPERIMENTS

Figure 5:
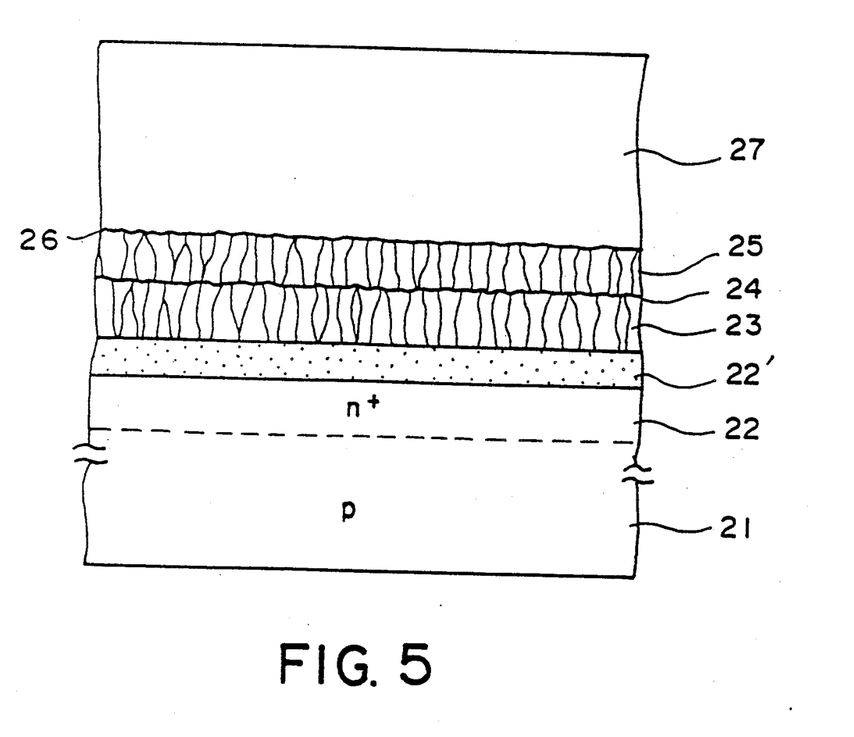
FIG. 5 is an enlarged cross sectional view similar to FIG. 4 showing another embodiment of the present invention.

Next, experiments conducted to evaluate the performance of the diffusion barrier structure having the two layer barrier metal structure, as shown in FIG. 5, in comparison with a corresponding structure using a single barrier metal layer will be described together with the result.

In a series of experiments, more than 100 barrier metal structures are prepared. Each of the barrier metal structures of FIG. 5 has a shape of a disk having a radius of 600 μm and comprises a p-type substrate 21 defined with a surface region 22 doped to the n+-type for a thickness of about 0.2–0.25 μm, a titanium layer 22' deposited on the surface region 22 for a thickness of about 400 Å for improving the electrical contact, a titanium nitride barrier metal layer 23 having a thickness of about 500 Å and deposited on the titanium layer 22' by reactive sputtering, an interface region 24 formed on the surface of the barrier metal layer 23 by oxygenation, another barrier metal layer 25 of titanium nitride having a thickness of about 500 Å and deposited on the interface layer by reactive sputtering similarly to the barrier metal layer 23, another interface layer 26 formed on the surface of the barrier metal layer 25 by oxygenation, and an electrode conductor layer 27 of aluminum-silicon alloy deposited on the interface layer 26. The aluminum-silicon alloy is the one commonly used for an electrode in semiconductor devices.

The formation of the interface layer 24 by oxygenation is carried out by annealing the structure of FIG. 5 in a reaction tube held at a temperature of about 450° C. for 30 minutes under a nitrogen gas flow. The reaction tube is not sealed completely so that a small amount of oxygen is allowed to penetrate into the reaction tube against the pressure of the nitrogen gas inside the tube, although the amount of oxygen thus introduced is extremely small. A part of oxygen thus penetrated into the reaction tube is incorporated into the barrier metal layer 23 and as a result there is formed the interface layer 24 enriched in oxygen. The amount of oxygen contained in the interface layer 24 is estimated to be extremely small judging from its golden color which is not changed substantially from the original color of titanium nitride. Therefore, the thickness of the interface layer 24 was not determined. Even with such a minute amount of oxygenation, it is sufficient to erase the effect of the microstructure in the layer 23 on the grain growth of the tungsten nitride crystals in the barrier metal layer 25 deposited on the layer 23. Thus, the grain boundary in the barrier metal layer 23 is made to be discontinuous to the grain boundary in the barrier metal layer 25 at the interface layer 24.

The formation of the interface layer 26 on the surface of the barrier metal layer 25 is made similarly to the interface layer 24 by annealing the structure of FIG. 5 at 450° C. for 30 minutes under the nitrogen gas flow containing the small amount of oxygen.

As a result of the heat treatment of the barrier metal, layers 23 and 25 in the atmosphere containing a small amount of oxygen as described, it is supposed that oxygen thus entered into the layers 23 and 25 is located at the grain boundaries. As the thickness of the layers 23 and 25 is only 500 Å which is significantly shorter than conventional thickness which is typically 1500 Å, it is reasonable to assume that the oxygen penetrates relatively deeply into each layers and the diffusion path of silicon and aluminum is blocked by oxygen effectively.

The evaluation of the diffusion barrier structure thus prepared is made by measuring the leakage current across a diode formed by the n+-type surface region 22 in the substrate and the rest of the substrate 21 doped to the p-type under a reverse bias voltage.

Further, the sample thus tested is annealed at 450° C. for 30 minutes under a pure nitrogen atmosphere free from oxygen so as to simulate the effect of heat treatment applied to the diffusion barrier structure during the manufacturing process of semiconductor. Then the leakage current is measured again for the annealed sample thus obtained under a same condition.

Figure 6A:
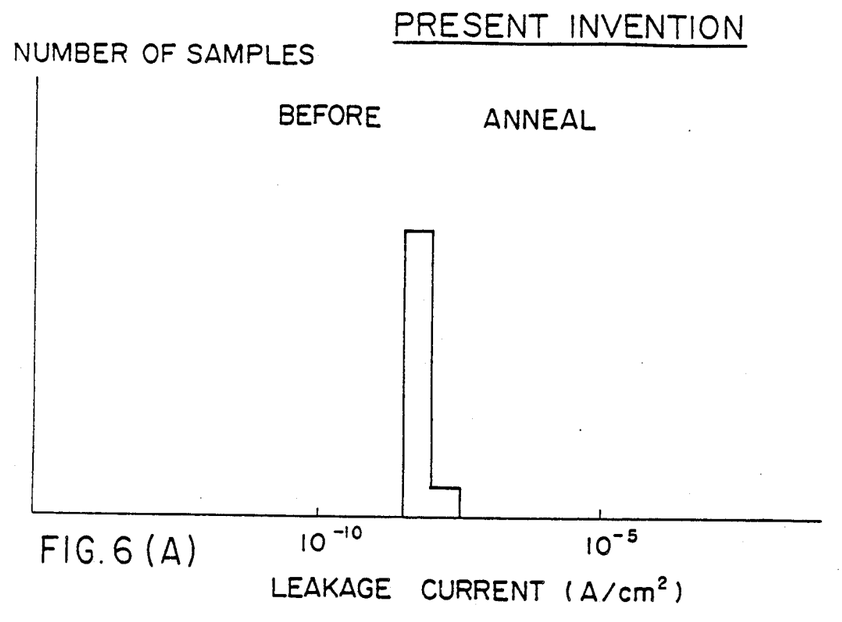
FIGS. 6(A)–6(D) are histograms showing a result of experiments conducted to compare the degree of reaction taking place across the diffusion barrier structure of the present invention with a prior art structure by measuring a leakage current.

FIGS. 6(A) shows the result of the leakage current measurement thus conducted for the samples before the annealing. It can be seen that the data points indicating the leakage current thus observed are converged in a narrow range which is typically in the order of about $10^{-8}$ A/cm$^2$. In this state, there should be no alloy spike formed across the pn-junction of the diode in the substrate 21.

Figure 6B:
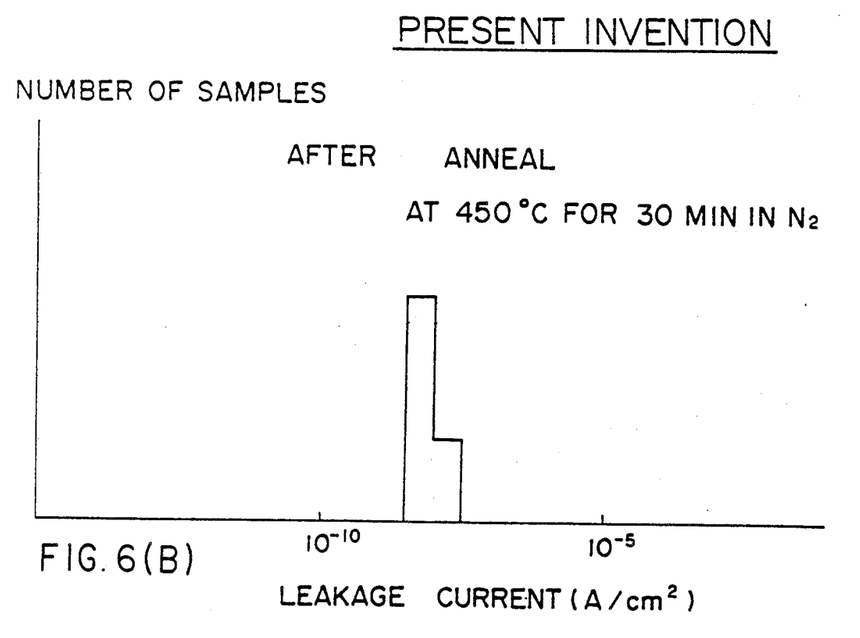

FIG. 6(B) shows the result of the leakage current measurement for the samples after such an annealing. It is clear from FIG. 6(B) that the distribution of the observed data is not changed substantially even after the annealing. The value of the leakage current remains on the order of $10^{-8}$ A/cm$^2$, even after the annealing. This indicates that no substantial alloy spike is formed in the substrate.

In order to compare the effect of the diffusion barrier structure of the present invention using the two barrier metal layers 23 and 25 with those of the conventional diffusion barrier structure having a single barrier metal layer, another series of samples (not shown) having the same radius of 600 μm are prepared for reference such that the reference samples have a structure which is identical to the structure shown in FIG. 5 except that a single barrier metal layer having a thickness of 1000 Å is used in place of the barrier metal layers 23 and 25. It should be noted that these samples are subjected to oxygenation under a condition which is same as the oxygenation of the barrier metal layer 25 of FIG. 5 after the single barrier metal layer is deposited in place of the layers 23 and 25.

Figure 6C:
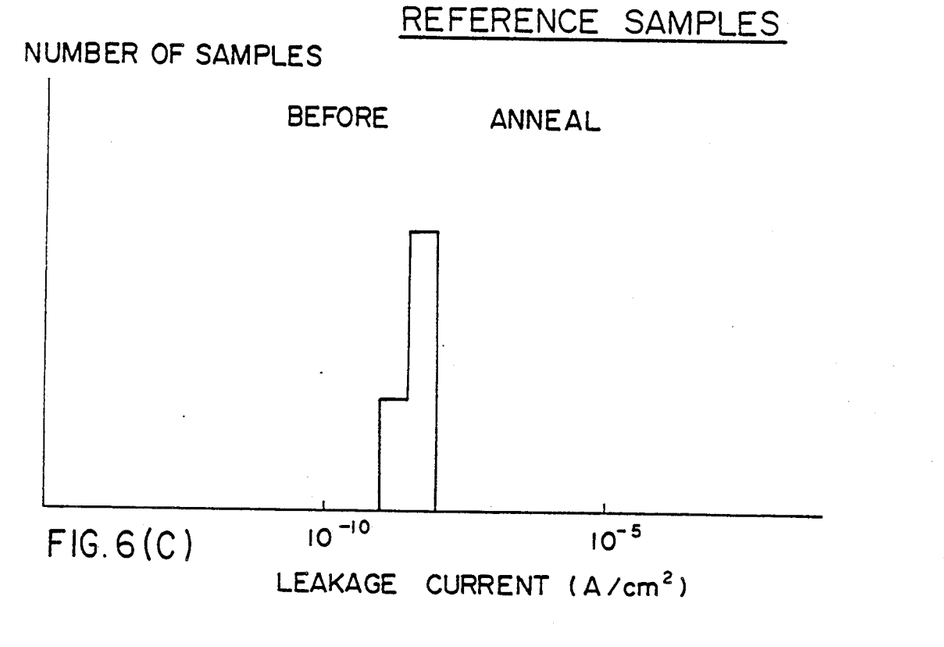
Figure 6D:
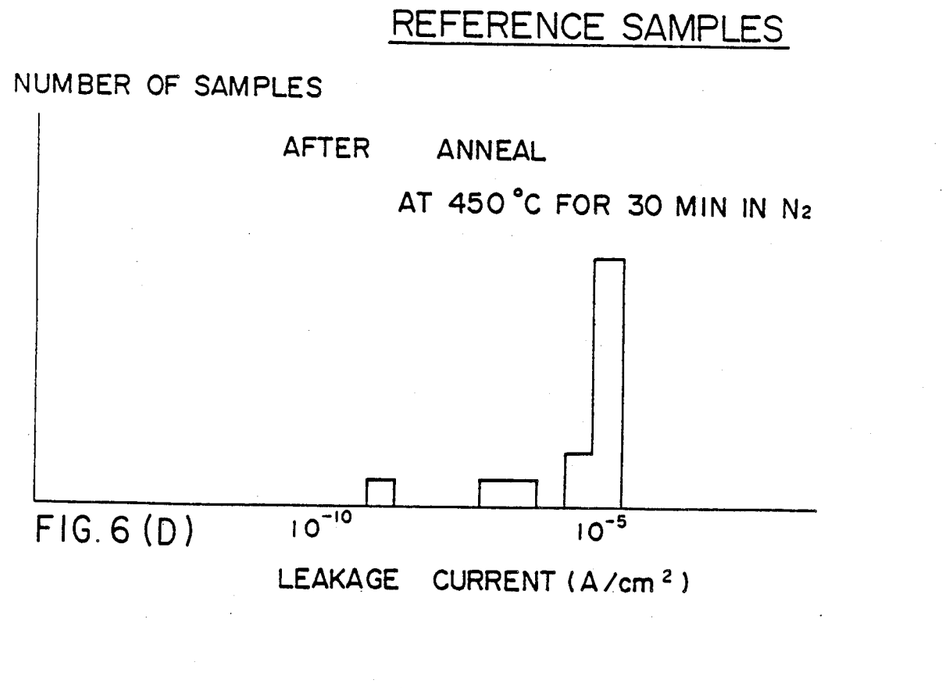

FIGS. 6(C) and 6(D) show the result of the leakage current measurements conducted for such reference samples before the annealing and after the annealing. As is clearly seen from these drawings, the leakage current data concentrated at the value of about $10^{-8}$ A/cm$^2$ before the annealing is scattered widely after the annealing and the peak of the distribution of the leakage current data is shifted to a position corresponding to the value of about $10^{-5}$ A/cm$^2$. This substantial increase in the leakage current after the annealing indicates that there would be a significant formation of the alloy spike in the substrate in spite of the thickness of the barrier metal layer and the oxygenation applied thereto.

From these experiments, it is clear that the leakage current across the diode in the substrate does not increase even with annealing at 450° C. for 30 minutes in the diffusion barrier structure of the present invention, while there is a substantial increase in the leakage current associated with the annealing in the case of the diffusion barrier structure using the single barrier metal layer. As both of the diffusion barrier structures are constructed substantially identical except for the single layer and two layer constructions of the barrier metal layers, this difference in the performance of the diffusion barrier structure should be attributed with certainty to the difference in the construction of the barrier metal layer used in the diffusion barrier structures. In other words, it is concluded that the two layer construction of the barrier metal layers used in the diffusion barrier structure of the present invention is far superior to the single barrier metal layer construction used in the prior art diffusion barrier structure.

Further, it may be concluded that the conventionally hypothetical mechanism of diffusion across the diffusion barrier structure that the elements are transported through the barrier metal layer along the grain boundary is now proved positively by these experiments.

Further, it should be noted that the interface layer is not necessarily the oxygen-enriched layer formed by oxygenation but may be an amorphous layer of titanium nitride formed by ion implantation of titanium, for example, as long as the interface layer thus formed can eliminate the effect of the microstructure in the barrier metal layer located underneath the interface layer on the growth of the crystal grains in the barrier metal layer deposited above the interface layer.

Further, the interface layer between the two barrier metal layers may be formed by changing the temperature of reactive sputtering abruptly when depositing the barrier metal layer in corresponding to the interface layer. In doing so, the microstructure of the titanium nitride crystal across the interface layer is discontinuously changed as a result of the abrupt change in the diameter of the grains across the interface layer. The interface layer formed by such a procedure takes a form of a simple boundary having no thickness and therefore provides an ideal electrical contact between the barrier metal layers across the interface. Further, such a procedure is preferable as the deposition of the first and second barrier metal layers can be made in a single manufacturing apparatus by merely changing the temperature stepwise.

Further, the shortened grain boundary in each of the barrier metal layers in the structure of the present invention facilitates the penetration of oxygen into the barrier metal layer along the grain boundary and the effect of blockage of diffusion of elements is enhanced as already described. Further, the reduced overall thickness in the barrier metal layers realizes a reduced resistance across the diffusion barrier structure. Of course, the electrical contact between the barrier metal layer and the substrate is improved by interposing a metal layer such as titanium as shown in the example of FIG. 5.

Further, the present invention is not limited to these embodiments but various variations and modifications may be made without departing from the scope of the present invention.

What is claimed is:

1. A contact structure for connecting a semiconductor portion of a semiconductor device to a metal electrode used in the semiconductor device, said contact structure preventing reaction between the semiconductor portion of a semiconductor device and the metal electrode, said contact structure comprising:
   a semiconductor layer forming the semiconductor portion of the semiconductor device, said semiconductor layer including a component element and having a top major surface;
   a metal electrode used in the semiconductor device for wiring, said metal electrode including a component element and having a bottom major surface;
   a first barrier layer of an electrically conductive material including at least one component element, said first barrier layer having an upper major surface and a lower major surface and provided on the top major surface of the semiconductor layer for preventing the component element of said semiconductor layer and the component element of said metal electrode from being transported therethrough, said first barrier layer having a microstructure wherein a plurality of grains of said electrically conductive material, each defined by a grain boundary, are assembled to each other;
   an interface region formed in the first barrier layer as a part of the first barrier layer along the upper major surface of the first barrier layer, said interface region having an upper major surface coincident to the upper major surface of the first barrier layer and consisting essentially of a material which contains all the component elements forming the material of said first barrier layer but substantially free from said component element forming said semiconductor layer, said interface region having a microstructure which is different from the microstructure of the first barrier layer; and
   a second barrier layer having a lower major surface and an upper major surface, said second barrier layer including a material substantially identical to that of the first barrier layer and having a microstructure including a plurality of grains of the material forming the second barrier layer each defined by a grain boundary, said second barrier layer provided on the upper major surface of the first barrier layer and under the lower major surface of the metal electrode so as to be sandwiched between the first barrier layer and the metal electrode, said second barrier layer provided with respect to the first barrier layer such that the grains in the second barrier layer are located generally in correspondence to the grain boundary in the first barrier layer, said microstructure of said interface region for preventing said component element of said semiconductor layer and said component element of said metal electrode from being transported across the interface region.

2. A contact surface as claimed in claim 1 in which each of said first and second barrier layers includes a layer of titanium nitride having a thickness of approximately 500 Å or less.

3. A contact surface as claimed in claim 1 in which each of said first and second barrier layers includes a layer of titanium tungstenite having a thickness of approximately 500 Å or less.

4. A contact surface as claimed in claim 1 in which said interface region includes an oxygen-enriched region formed on the surface of the first barrier layer.

5. A contact surface as claimed in claim 1 in which said interface region includes an amorphous layer formed at the surface of the first barrier layer, said amorphous layer being a layer wherein grains and grain boundaries are eliminated.

6. A contact surface as claimed in claim 1 further comprises a contact layer of an electrically conductive material for improving electrical contact between the first barrier layer and the semiconductor portion, said contact layer being defined by a lower major surface and an upper major surface and provided such that the contact layer is sandwiched between the semiconductor portion and the first barrier layer.

* * * * *